United States Patent
Terada et al.

(10) Patent No.: US 6,961,994 B2
(45) Date of Patent: Nov. 8, 2005

(54) METHOD OF HIGH-SPEED AND ACCURATE ALIGNMENT USING A CHIP MOUNTING DEVICE

(75) Inventors: Katsumi Terada, Shiga (JP); Akira Yamauchi, Shiga (JP)

(73) Assignee: Toray Engineering Co., Ltd., Osaka (JP)

(*) Notice: Subject to any disclaimer, the term of this patent is extended or adjusted under 35 U.S.C. 154(b) by 400 days.

(21) Appl. No.: 10/221,142

(22) PCT Filed: Mar. 8, 2001

(86) PCT No.: PCT/JP01/01798

§ 371 (c)(1),
(2), (4) Date: Sep. 10, 2002

(87) PCT Pub. No.: WO01/67839

PCT Pub. Date: Sep. 13, 2001

(65) Prior Publication Data

US 2003/0046812 A1 Mar. 13, 2003

(30) Foreign Application Priority Data

Mar. 10, 2000 (JP) .......................... 2000-067247

(51) Int. Cl.$^7$ ................................. H05K 3/30
(52) U.S. Cl. ........................ 29/833; 29/832; 29/739; 29/740; 29/720
(58) Field of Search ............... 29/832, 833, 739, 29/740, 720

(56) References Cited

U.S. PATENT DOCUMENTS

| | | | |
|---|---|---|---|
| 4,747,198 A | | 5/1988 | Asai et al. |
| 4,794,689 A | * | 1/1989 | Seno et al. .................... 29/740 |
| 5,070,598 A | * | 12/1991 | Itagaki et al. ................. 29/705 |
| 5,084,962 A | * | 2/1992 | Takahashi et al. ............. 29/833 |

FOREIGN PATENT DOCUMENTS

| | | |
|---|---|---|
| JP | 61-167802 A | 7/1986 |
| JP | 7-7028 A | 1/1995 |
| JP | 7-193102 A | 7/1995 |
| JP | 11-87432 A | 3/1999 |

* cited by examiner

Primary Examiner—Richard Chang
(74) Attorney, Agent, or Firm—Smith Patent Office

(57) ABSTRACT

A mounting device including a plurality of heads, each holding a chip, arranged on a circle, is used to realize accurate and high-speed mounting. A mounting device comprises a plurality of heads with calibration marks, first recognition mechanism fixed in a chip mounting position, and second recognition mechanism fixed in another position. Prior to mounting operation, the first recognition mechanism and the second recognition mechanism recognize and store the positions of the calibration marks of the heads. In mounting operation, the first recognition mechanism recognizes the positions of a substrate and the calibration marks of the heads, whereas the second recognition mechanism recognizes the positions of chips attracted on the heads. The heads are moved vertically to adjust plane to be recognized. The chip and the substrate are aligned according to the position information obtained by the recognition mechanisms, and the chips are mounted.

9 Claims, 3 Drawing Sheets

METHOD OF HIGH-SPEED AND ACCURATE ALIGNMENT USING A CHIP MOUNTING DEVICE

BACKGROUND OF THE INVENTION

1. Field of the Invention

The present invention relates to a chip mounting device and a method of alignment thereof, and specifically to a chip mounting device capable of performing high-speed and accurate alignment and an alignment method in the chip mounting device.

2. Discussion of the Related Art

As well known, in a conventional chip mounting device, the position of a chip held by a head and the position of a substrate (for example, a liquid crystal panel, etc.) supported by a substrate holding stage disposed below the head are precisely positioned, and in this condition, chip mounting is performed by moving the head down.

In order to raise the working efficiency of the mounting operation and shorten the tact time in such a chip mounting device, a so-called rotary-head type chip mounting device is known wherein a plurality of heads are provided and each head is moved in order between a position for receiving a chip and a position for mounting the chip onto a substrate (for example, JP-A-7-193102).

On the other hand, chip mounting devices can be roughly classified into devices for bonding chips (bonders) and devices for mounting chips (mounters). A bonder bonds a chip held by a head to a substrate by heating and pressing. A mounter basically does not heat a chip held by a head, but merely places the chip on a substrate or temporarily bonds the chip to the substrate, and thereafter the chip is permanently bonded by using a heating furnace, etc.

Generally, in a bonder, the positions of a chip and a substrate facing each other are recognized severally, at a position for mounting the chip onto the substrate immediately before mounting. For example, the positions of the chip and the substrate are recognized by two-sight recognition means, and after an amount in shift of the relative positional relationship therebetween is amended, the mounting operation is performed. The two-sight recognition means provided as a position recognition means is usually provided in a chip mounting device so as to be inserted before recognition and to be retreated after recognition. Thus, it becomes possible to bond a chip and a substrate at a high accuracy by controlling the positions based on the information of the relative positional relationship obtained by the two-sight recognition means. For example, it is possible to bond them at an accuracy of about 5 μm or less. On the other hand, because the two-sight recognition means is inserted and retreated at a chip mounting position, other operations cannot be performed during its operation, so there is a limit in shortening of the time of a series of operations in the device. Therefore, even if the device is constructed as a rotary-head type chip mounting device as described above, there is a limit in shortening of the tact time.

In a mounter, the construction of a rotary-head type chip mounting device is fairly popular, and therefore, high-speed mounting is possible. In this type of mounter, usually, the recognition of the position of a substrate is performed at a position separated from the chip mounting device and before the substrate is supplied to the chip mounting device. Therefore, the mounting operation in the chip mounting device can be performed in a short period of time, and the tact time of the device as a whole can be shortened. However, because an amount in shift of the relative position is not amended at the actual chip mounting position, the bonding accuracy of the substrate and the chip is not improved so much, and the accuracy is limited to a maximum of about 100 μm. Although such a mounter has been used for applications that do not require a high accuracy, recently the demand for high accuracy in a mounter has been increased, and therefore, the conventional mounter cannot satisfy the requirement.

SUMMARY OF THE INVENTION

Accordingly, an object of the present invention is to provide a chip mounting device and an alignment method in the chip mounting device which can mount a chip at a speed of a conventional mounter (for example, about one chip mounting operation per second) or faster (for example, one chip mounting operation in less than a second) and with an accuracy of a conventional bonder (for example, a chip mounting accuracy of about 5 μm) or a higher accuracy (for example, a chip mounting accuracy of a submicron).

Namely, an object of the present invention is to enable mounting at a speed as fast as or faster than a conventional mounter when the chip mounting device according to the present invention is applied as a bonder. This object includes shortening the tact time greatly, and enabling a mounting with the same or higher accuracy than a conventional bonder when the chip mounting device according to the present invention is applied as a mounter.

To accomplish the above object, a chip mounting device according to the present invention has a plurality of heads each holding a chip, and a rotary mechanism moving the plurality of heads along a circular orbit to a plurality of positions including at least a position for receiving a chip and a position for mounting the chip onto a substrate, and the chip mounting device comprises a first recognition means disposed in a chip mounting position on the circular orbit for recognizing a position of the substrate held on a substrate stage, and a second recognition means disposed in another position on the circular orbit different from the chip mounting position for recognizing a position of the chip held on a head.

In the present invention, the first and second recognition means include all means capable of recognizing recognition marks such as CCD cameras, infrared cameras, X-ray cameras and sensors. The "chip" includes all objects with forms being bonded to a substrate such as IC chips, semiconductor chips, optoelectronic elements and wafers. Further, the "substrate" includes all objects with forms being bonded to a chip, a wafer, etc., such as resin substrates, glass substrates and film substrates.

In this chip mounting device, it is preferred that the above-described first and second recognition means are connected to a position control means for amending an amount in shift of the relative positional relationship between the substrate and the chip, for each head, based on positional information of the substrate and the chip recognized by both recognition means. Further, in the chip mounting device, the positions of the substrate and the chip may be recognized directly by the first and second recognition means, respectively, and a calibration mark provided on a head side may be recognized by the second recognition means and the same mark may be further recognized by the first recognition means, and calibration may be performed based on the recognition information from both of the recognition means. The calibration mark may be provided on the head itself or may be provided on a member for calibration incorporated into the head (for example, a member formed by a transparent glass plate), or a member for calibration having a shape similar to that of a chip held by the head (for example, a member formed by a transparent glass plate) and the calibration mark may be provided on the member. When the calibration mark is provided on head side, a chip position reading mechanism including the second recognition means is constructed as a mechanism capable of reading the calibration mark provided on head side, and a substrate position reading mechanism including the first recognition means is constructed as a mechanism capable of reading the identical calibration mark when the head provided with the calibration mark is moved (rotated) to the chip mounting position. Namely, in order to be able to read the same calibration mark at the position of the second recognition means as well as at the position of the first recognition means, a structure having a transparent glass plate or a structure having a through hole may be employed.

Further, in a case where the calibration mark is provided on a head at a position with a height different from the height of a chip held on the head, in order to remove the difficulty in focusing the second recognition means, etc. at the time of recognition and in order to shorten the time for focusing, it is preferred to adjust the height of the calibration mark to the height of chip actually held by the head at the positions of the respective recognition means. Namely, it is preferred that each head has a head vertically moving means for adjusting the height of the calibration mark to the height of the chip held by the head at calibration mark reading positions of the first and second recognition means. By calibrating the position for each head, it becomes possible to store the characteristics of each head precisely.

A method of alignment according to the present invention is provided as an alignment method in a chip mounting device having a plurality of heads each holding a chip, and a rotary mechanism moving the plurality of heads along a circular orbit to a plurality of positions including at least a position for receiving a chip and a position for mounting the chip onto a substrate, and the method comprises the steps of recognizing a position of the substrate on a substrate stage at a chip mounting position on the circular orbit by a first recognition means; recognizing a position of the chip held on each head at a position before reaching the chip mounting position on the circular orbit, which is different from the chip mounting position, by a second recognition means; and controlling the relative positional relationship between the substrate and the chip at the chip mounting position within a target accuracy.

In this alignment method, it is preferred that, after a calibration mark provided on head side is read by the second recognition means, the calibration mark is read by the first recognition means when the calibration mark is moved to the chip mounting position together with the head, and an amount of calibration in position is determined for each head based on information read by both recognition means.

Further, in a case where the calibration mark is provided within the head, when the calibration mark is read by the first and second recognition means, at the respective reading positions the height of the calibration mark is controlled at the same height as the height of a chip held by the head by moving the head vertically.

In the above-described chip mounting device and method of alignment thereof according to the present invention, the heads are moved (rotated) from the chip receiving position to the chip mounting position onto the substrate by a so-called rotary head system. In this rotary movement, the position of the chip is recognized by the second recognition means at an intermediate position before reaching the chip mounting position, and the position of the substrate is recognized by the first recognition means before the chip and the head holding the chip reach the chip mounting position. Therefore, as compared with a case of a conventional bonder wherein recognition means is inserted into and retreated from a chip mounting position and both positions of a chip and a substrate are recognized at the chip mounting position, the time of recognition of the respective positions for adjusting the relative positional relationship can be greatly shortened, the whole time of a series of operations for chip mounting can be greatly shortened, and the tact time can be shortened. Namely, it becomes possible to realize an operation speed as fast as the speed of a conventional mounter, or a faster operation speed because the substrate mark and the chip mark are read during the rotation of the rotary head.

Further, because the position of the substrate is recognized at the chip mounting position as compared with a conventional mounter, at least the accuracy in recognition of the position of the substrate may be greatly increased, and it becomes possible to realize an accuracy as high as the accuracy in a conventional bonder. In particular, if a calibration mark is provided and the same calibration mark is read at both positions of the second and first recognition means, the characteristics of heads moved toward the chip mounting position, such as the characteristic of positional shift, can be determined for each head, and therefore, an extremely high-accuracy positioning becomes possible. Namely, while the system for moving a plurality of heads successively toward the chip mounting position is employed for high-speed mounting, a precise positioning between the substrate and the chip at the chip mounting position becomes possible, and therefore, it becomes possible to realize an accuracy as high as the accuracy of a conventional bonder, or a higher accuracy.

Thus, in the chip mounting device and method of alignment thereof according to the present invention, a high-speed mounting at an operation speed of a conventional mounter or a faster operation speed becomes possible, and at the same time, a high-accuracy mounting at an accuracy of a conventional bonder or a higher accuracy becomes possible. Therefore, particularly, the tact time of a bonder can be greatly shortened, and the chip mounting accuracy of a mounter can be greatly increased.

DETAILED DESCRIPTION OF THE PREFERRED EMBODIMENTS

Hereinafter, desirable embodiments of the present invention will be explained referring to figures.

Figure 1:
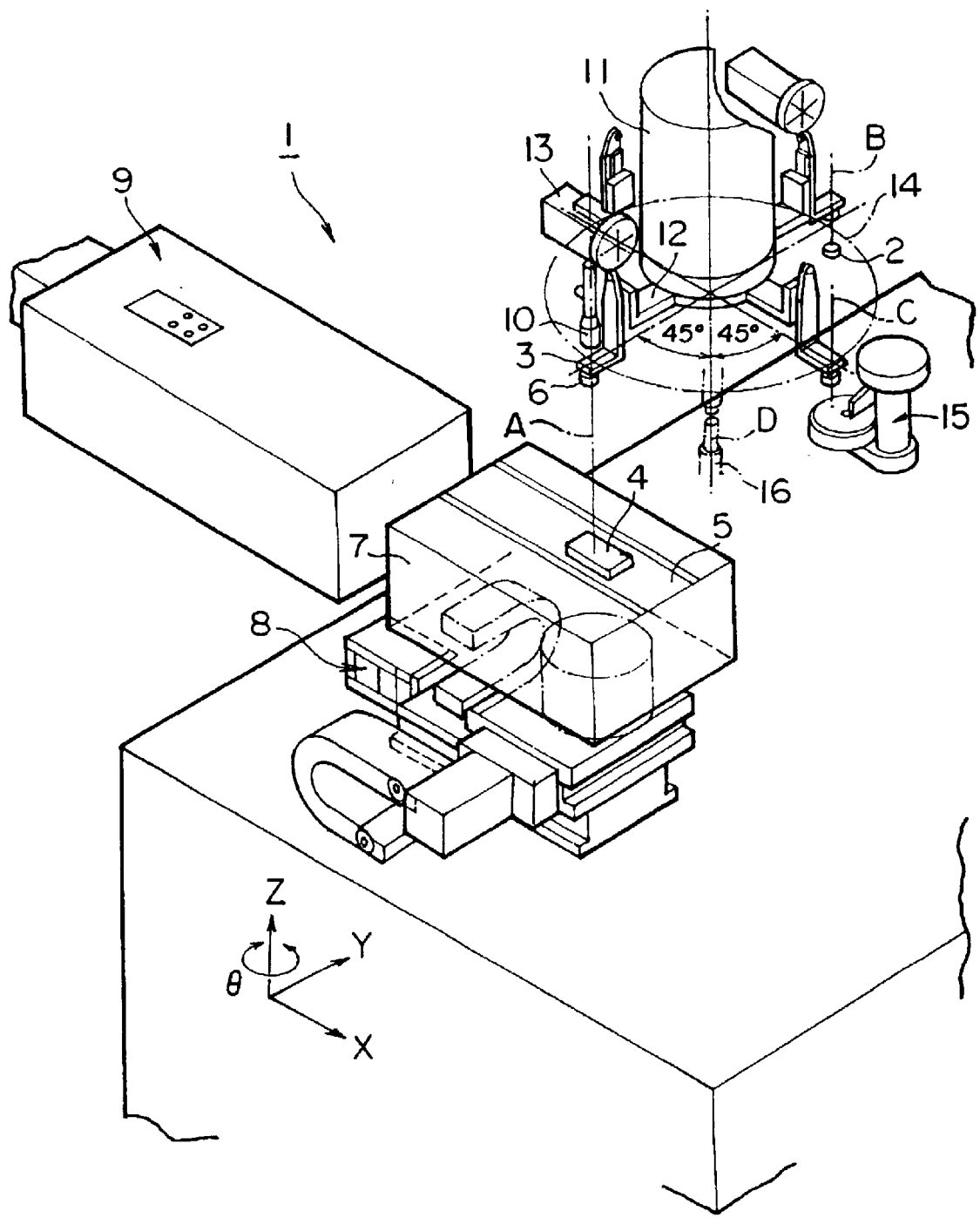
FIG. 1 is a schematic perspective view of a chip mounting device according to an embodiment of the present invention.
Figure 2:
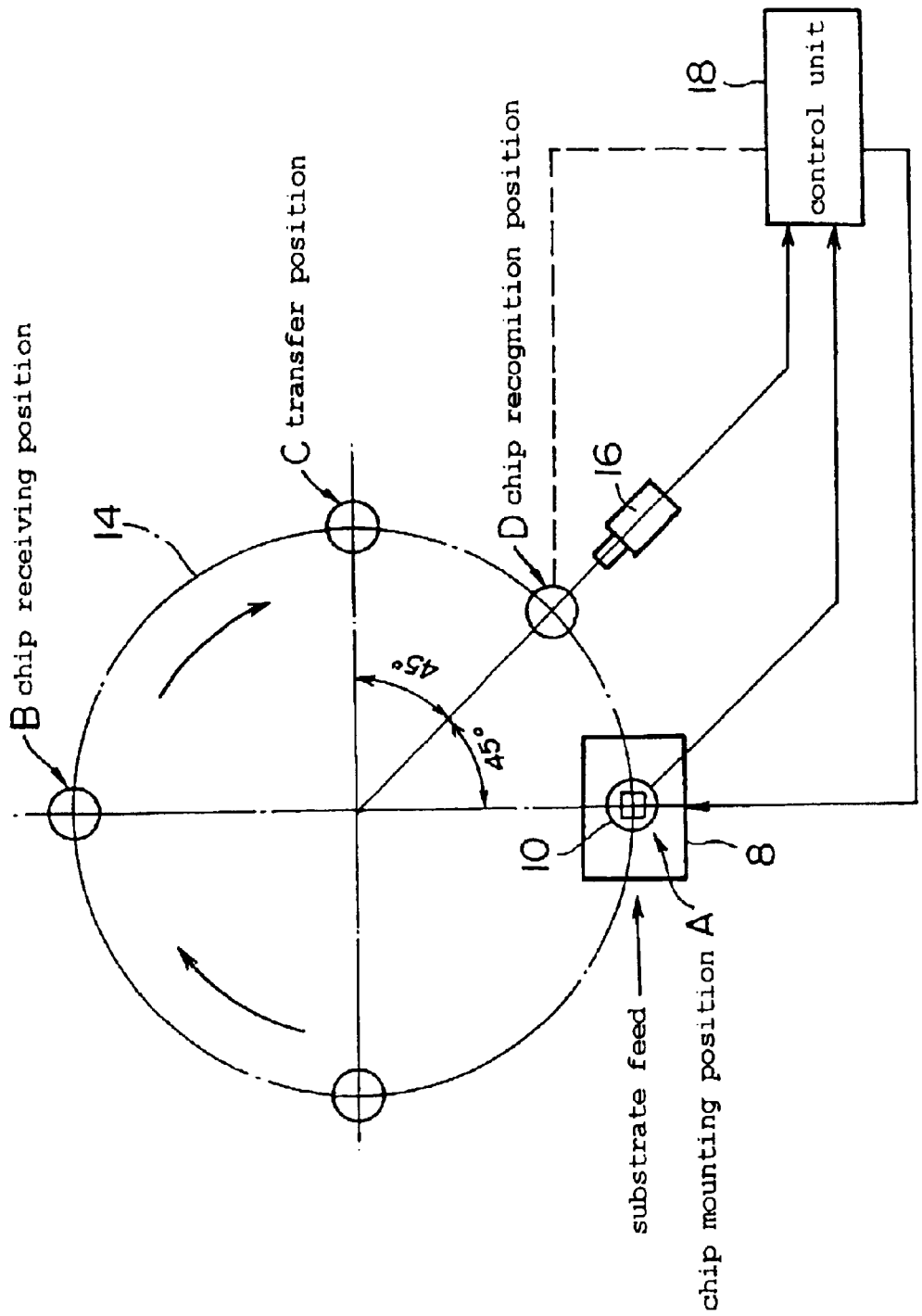
FIG. 2 is a schematic view showing respective positions on a rotary, circular orbit of heads in the device shown in FIG. 1.
Figure 3:
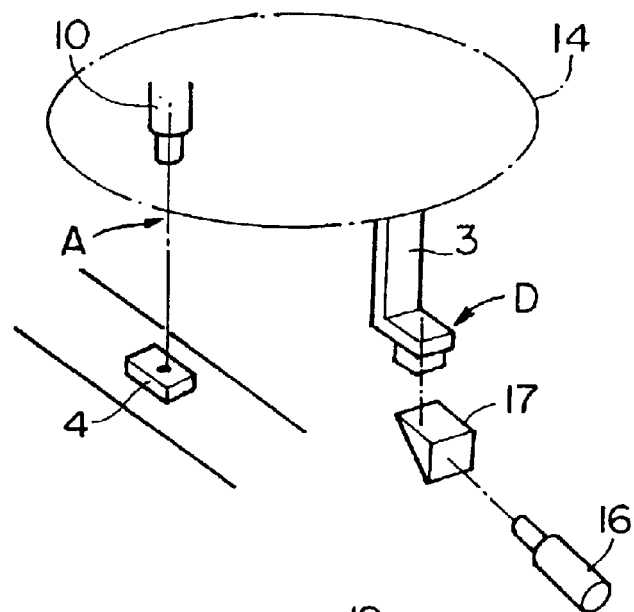
FIG. 3 is a schematic perspective view showing the state of recognition of positions by a second recognition means and a first recognition means.

FIGS. 1 to 3 show a chip mounting device according to an embodiment of the present invention. In FIG. 1, a chip mounting device 1 has a plurality of heads 3 each holding a chip 2 by suction, etc., and a substrate holding stage 5 (substrate stage) provided below the head 3 for holding a substrate 4 such as a circuit board or a liquid crystal panel by suction, etc. The head 3 holds the chip 2 by attraction, etc., on the lower surface of a tool 6 provided at the lower end of the head 3. When the chip mounting device 1 is constructed as a bonder, the tool 6 is structured so as to be able to heat by being incorporated with a heater, and when it is constructed as a mounter, a heater is not incorporated. Namely, the tool 6 may be structured in a form either with or without a heater.

In this embodiment, the substrate holding stage 5 is fixed on a slide table 7, and a chip mounting position on the substrate 4 held on the substrate holding stage 5 can be moved as needed by the sliding operation of the slide table 7. The slide table 7 is provided on a movable table 8 capable of adjustment in a horizontal direction along the X axis, in a direction perpendicular thereto along the Y axis and a vertical direction along the Z axis, and adjustment of angle in a e direction around a rotation axis. The substrate 4 supplied from a substrate feed device 9 to the slide table 7 is positioned at the chip mounting position A. The positioning immediately before mounting is performed in response to a relative position control demand based on the position recognition information of the substrate 4 due to a first recognition means 10 provided as a recognition means for recognizing the position of the substrate 4 and the position recognition information of the chip 2 from a second recognition means described later.

A plurality of the heads 3 (four heads in this embodiment) are provided, and they are attached to a rotary head unit 11 at a same interval (at 90 degrees apart between adjacent heads in this embodiment) in the rotation direction. Each head 3 is attached to each arm 12 of the rotary head unit 11 via a vertical movement unit 13, and in this embodiment, each head 3 can be moved only vertically in the Z-axis direction along a predetermined linear path. However, also for this head 3, a mechanism capable of fine adjustment in the X-axis direction, the Y-axis direction and the θ-direction may be provided similarly to that on the substrate side as described above. The four heads 3 are moved in the rotation direction along a specific circular orbit 14 by the rotational operation of the rotary head unit 11.

As shown also in FIG. 2, at least a chip receiving position B, at which the head 3 receives the chip 2, and the above-mentioned chip mounting position A are set on this circular orbit 14. The chip receiving position B and the chip mounting position A are set at opposite positions separated from each other by 180 degrees, and in this embodiment, at 90 degree position, which is an intermediate position therebetween, a transfer position C for transferring flux or paste is further set. In the transfer position C, a transfer unit 15 is provided for transferring flux or paste to the chip 2.

At an intermediate position between the chip receiving position B and the chip mounting position A which is different from the chip mounting position A, in this embodiment, at a 45 degree position D which is just an intermediate position between the transfer position C and the chip mounting position A, a second recognition means 16 is provided as a recognition means for recognizing the position of the chip 2 held on the head 3. In this embodiment, as shown in FIG. 3, the second recognition means 16 recognizes the position of the chip 2 at a non-contact condition from the outside of the circular orbit 14 via a prism 17. The first recognition means 10 recognizes the position of the substrate 4 from an upper side, basically when the head 3 is not positioned below the first recognition means 10, as shown in FIG. 3, for example. However, if a through hole is formed in the head 3, even when the head 3 is present at the chip mounting position A, the position of the substrate 4 can be recognized by the first recognition means 10 from an upper side. The information of the position of the chip 2 at the position D recognized by the second recognition means 16 and the information of the position of the substrate 4 at the chip mounting position A recognized by the first recognition means 10 are input into a control unit 18 comprising a micro computer, as shown in FIG. 2. In the control unit 18, the relative positional relationship between the chip 2 and the substrate 4 at the chip mounting position A is calculated from both positional informations, and based on the calculation, an amount of the relative positional relationship to be amended is calculated for adjusting the relative position within a target positional accuracy. This calculation is performed for each head 3, and a high-accuracy alignment may be performed for each head 3 being moved in order. In this embodiment, the amendment of the relative position is performed based on the control signal from the control unit 18 by the side of the substrate 4, that is, by the movable table 8. However, as aforementioned, it is possible to operate the amendment by the side of the head 3, or by the both sides.

Figure 4:
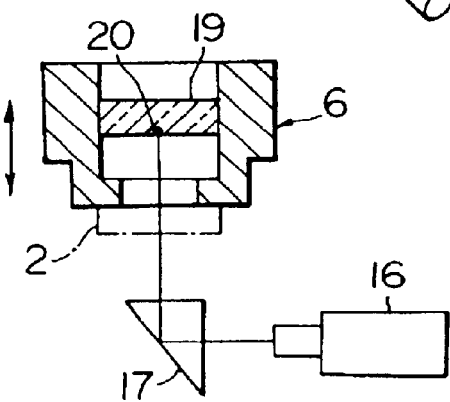
FIG. 4 is a schematic vertical sectional view showing a vertical movement of a head at the position of the second recognition means.

In the above-described chip mounting device 1, a function for calibration can be further provided. For example, as shown in FIG. 4, a transparent glass plate 19 is provided in the head 3, and a recognition mark 20 for calibration is provided on the transparent glass plate 19. This calibration mark 20 is read at both the position D and the chip mounting position A by the second recognition means 16 and the first recognition means 10, respectively. Because the same calibration mark 20 is read, the characteristic of an amount in shift of the position of the head 3 is determined for each head 3, and if an amount to be calibrated is stored for each head 3 based on the information, it becomes possible to give feedback on the stored amount to be calibrated to the amendment of the relative positional relationship between the chip 2 and the substrate 4 in chip mounting each time.

Figure 5:
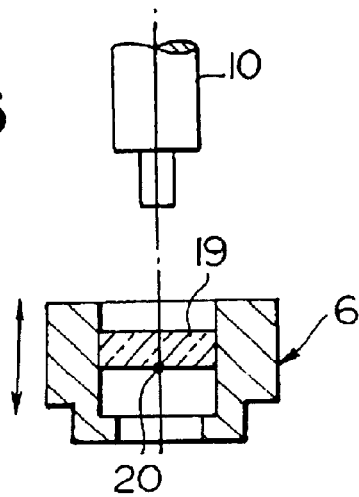
FIG. 5 is a schematic vertical sectional view showing a vertical movement of a head at the position of the first recognition means.

In this embodiment, because the position of the calibration mark 20 in the vertical direction is different from the position of the chip 2 actually held on the head 3 in the vertical direction (depicted by the two-dot chain line in FIG. 4), it is preferred to adjust the height of the calibration mark 20 to the height of the chip 2 by moving the head 3 vertically at the position D provided with the second recognition means 16 so as to easily and quickly focus the second recognition means 16 when the calibration mark 20 is read. In this embodiment, the head 3 is moved down for the focusing. Similarly, as shown in FIG. 5, also at the chip mounting position A, it is preferred to adjust the height of the calibration mark 20 to the height of the chip 2 by moving the head 3 vertically so as to easily and quickly focus the first recognition means 10 when the calibration mark 20 is read.

Thus, by adjusting the reading position of the calibration mark 20 to the height of the chip 2, the second recognition means 16 and the first recognition means 10 can be used for recognizing the actual positions of the chip 2 and the substrate 4, as well as for the above-described calibration by reading the identical calibration mark 20, with no problem.

For the above-described calibration, except for the structure wherein the transparent glass plate 19 having the calibration mark 20 is provided in the head 3, a structure may be employed wherein a calibration mark is merely provided at an appropriate position of the head 3 itself.

Further, another structure may be employed wherein a standard chip for calibration having a shape similar to that of the chip 2 (not shown) is prepared without providing a transparent glass plate 19 in the head 3, and the standard chip is made of a transparent glass and a calibration mark is provided thereon. In such a structure, because the control of the height of the calibration mark described above becomes unnecessary, the operation may be facilitated, and at the same time, a fear of deterioration of the final control accuracy originating from the height control of the calibration mark 20 may be removed.

Further, a structure may be employed wherein a second recognition means 16 is disposed at the transfer position C, thereby recognizing the position of the chip 2 when another chip is mounted on a substrate at the chip mounting position A (when the movement of the head 3 is stopped).

Although the chip recognition position D and the second recognition means 16 are disposed at the 45 degree position which is an intermediate position between the transfer position C and the chip mounting position A, they may be disposed at any other position as long as the position is present on the circular orbit formed between the transfer position C and chip mounting position A.

Further, in case a positional shift does not occur at the transfer position C where an adhesive such as paste is transferred to a chip, the chip recognition position D and the second recognition means 16 may be disposed at the chip receiving position B or at an appropriate position on the circular orbit formed between the chip receiving position B and the transfer position C. When they are disposed on the circular orbit, the position of a chip may be recognized either during a time when the head 3 is passing through the chip recognition position D or when the movement of the chip is stopped.

In the chip mounting device 1 thus constructed, a rotary head system is employed wherein a plurality of the heads 3 are moved by rotation. Since the position of the chip 2 can be recognized at the position D before reaching the chip mounting position A by the second recognition means 16, the time for recognizing the position of the chip 2 can be greatly shortened, as compared with that of a conventional bonder which reads the position by a two-sight recognition means after a chip reaches the chip mounting position. Because it is possible to perform this recognition of the position of the chip 2 without stopping the rotary motion of the head 3 at the position 0, a further shortening of time may be possible. Moreover, because the recognition of the position of the substrate 4 can be performed by the first recognition means 10 from upper side at a time when the head 3 has not yet reached the upper position of the substrate 4, the time for recognizing the position of the substrate 4 can also be greatly shortened. Namely, when the chip 2 held on the head 3 reaches the chip mounting position A, the recognition of the position of the chip 2 and the recognition of the position of the substrate 4 have been already completed. Therefore, a great shortening of time becomes possible as compared with a conventional bonder.

Further, since the first recognition means 10 is provided at the chip mounting position A, the accuracy in recognizing the position of the substrate 4 can be greatly increased, as compared with a case of a conventional mounter where the recognition means is provided at a position different from the chip mounting position A. The positional amendment is performed based on the positional information of the chip 2 recognized in advance and the positional information of the substrate 4 so that the relative positional relationship therebetween can be set within a target accuracy, and therefore, a high-accuracy alignment can be performed before actual mounting.

Furthermore, if the calibration mark 20 is used, the same calibration mark 20 is read by both of the second recognition means 16 and the first recognition means 10 and the calibration is performed based on the information, the characteristic and the tendency of each head 3 can be precisely determined prior to the actual mounting operation. By incorporating such data into the control of positioning at the time of the actual chip mounting operation, while using a rotary head system, an extremely high-accuracy alignment becomes possible. Namely, accuracy as high as that of a conventional bonder, or a higher accuracy, may be easily ensured.

As a result, a great shortening of the tact time as well as an extremely high-accuracy alignment may be possible. In particular, in a case where the present invention is applied to a bonder, the tact time can be greatly shortened, and in a case where the present invention is applied to a mounter, the accuracy in chip mounting can be greatly increased. In the present invention, in a case where a recognition mark can be recognized from a lower side such as a transparent substrate or a substrate provided with a mark on its back surface, or in a case where, even if a recognition mark cannot be recognized directly from a lower side, the mark can be recognized by using a transmitting means such as an infrared means or an X-ray means as a recognition means, a first recognition means for recognizing a substrate mark may be provided at a lower side.

INDUSTRIAL APPLICATIONS OF THE INVENTION

The chip mounting device and the method of alignment thereof according to the present invention are suitable for a rotary-head system bonder and mounter. When the present invention is applied to a bonder, especially an advantage for greatly shortening the tact time can be obtained, and when the present invention is applied to a mounter, especially an advantage for greatly increasing the accuracy of chip mounting can be obtained.

What is claimed is:

1. A method of alignment in a chip mounting device having a plurality of heads each holding a chip, and a rotary mechanism moving the plurality of heads along a circular orbit to a plurality of positions including at least a position for receiving a chip and a position for mounting the chip onto a substrate, comprising the steps of:

sensing a position of the substrate on a substrate stage at a chip mounting position on the circular orbit by a first recognition means;

recognizing a position of the chip held on each head at an intermediate position between the chip receiving position and the chip mounting position on the circular orbit, which is different from the chip mounting position, by a second recognition means;

controlling the relative positional relationship between the substrate and the chip at the chip mounting position within a target accuracy reading a calibration mark provided on a head side by the second recognition means; moving the calibration chip mounting head following said step of mark to the position together with the reading a calibration mark; reading the calibration mark by the first recognition means following said step of moving the calibration mark; and determining an amount of calibration for each head based on information read by the first and second recognition means.

2. A method of alignment in a chip mounting device having a plurality of heads each holding a chip, and a rotary mechanism moving the plurality of heads along a circular orbit to a plurality of positions including at least a position for receiving a chip and a position for mounting the chip onto a substrate, comprising the steps of:

recognizing a position of said substrate on a substrate stage at a chip mounting position on said circular orbit by first recognition means;

recognizing a position of said chip held on each head at a position before reaching said chip mounting position on said circular orbit, which is different from said chip mounting position, by second recognition means; and controlling the relative positional relationship between said substrate and said chip at said chip mounting position within a target accuracy;

wherein, after a calibration mark provided on head side is read by said second recognition means, said calibration mark is read by said first recognition means when said calibration mark is moved to said chip mounting position together with said head, and an amount of calibration in position is determined for each head based on information read by both recognition means.

3. The method of alignment in a chip mounting device according to claim 2, wherein said calibration mark is provided within said head, and when said calibration mark is read by said first and second recognition means, at the respective reading positions the height of said calibration mark is controlled at the same height as the height of a chip held by said head by moving said head vertically.

4. The method of alignment in a chip mounting device according to claim 1, further comprising the steps of:

providing the calibration mark within the head; and controlling the height of the calibration mark to be the same height as the height of a chip held by the head by moving the head vertically when the calibration mark is read by the first and second recognition means, at the respective reading positions.

5. A method of alignment in a chip mounting device having a plurality of heads each holding a chip, and a rotary mechanism moving the plurality of heads along a circular orbit to a plurality of positions including at least a position for receiving a chip and a position for mounting the chip onto a substrate, comprising the steps of:

sensing a position of the substrate on a substrate stage at a chip mounting position on the circular orbit by a first recognition means;

providing a transfer unit for transferring bonding material to the chip at a first intermediate position between the chip receiving position and the chip mounting position on the circular orbit;

recognizing a position of the chip held on each head at a second intermediate position between the chip receiving position and the chip mounting position on the circular orbit, which is different from the chip mounting position, by a second recognition means;

controlling the relative positional relationship between the substrate and the chip at the chip mounting position within a target accuracy reading a calibration mark provided on a head side by the second recognition means; chip mounting position together with the head following said step of reading a calibration mark; reading the calibration mark by the first recognition means following said step of moving the calibration mark; and determining an amount of calibration for each head moving the calibration mark to the based on information read by the first and second recognition means.

6. The method of alignment in a chip mounting device according to claim 5, further comprising the steps of:

providing the calibration mark within the head; and controlling the height of the calibration mark to be the same height as the height of a chip held by the head by moving the head vertically when the calibration mark is read by the first and second recognition means, at the respective reading positions.

7. The method of alignment in a chip mounting device according to claim 5, wherein said step of recognizing a position of the chip includes using a prism and a tool having a calibration mark.

8. The method of alignment in a chip mounting device according to claim 5, wherein said step of sensing a position of the substrate includes using a tool having a calibration mark.

9. The method of alignment in a chip mounting device according to claim 5, wherein the first intermediate position in said step of providing the transfer unit and the second intermediate position in said step of recognizing the position of the chip are the same.

* * * * *